(12) United States Patent
Hsiung et al.

(10) Patent No.: US 10,269,897 B2
(45) Date of Patent: Apr. 23, 2019

(54) POWER METAL-OXIDE-SEMICONDUCTOR FIELD-EFFECT TRANSISTOR DEVICE WITH THREE-DIMENSIONAL SUPER JUNCTION AND FABRICATION METHOD THEREOF

(71) Applicant: Leadtrend Technology Corp., Hsinchu County (TW)

(72) Inventors: Chih-Wen Hsiung, Hsinchu County (TW); Jen-Hao Yeh, Hsinchu County (TW); Yi-Rong Tu, Hsinchu County (TW); Wan-Wen Tseng, Hsinchu County (TW)

(73) Assignee: Leadtrend Technology Corp., Hsinchu County (TW)

( * ) Notice: Subject to any disclaimer, the term of this patent is extended or adjusted under 35 U.S.C. 154(b) by 4 days.

(21) Appl. No.: 15/867,744

(22) Filed: Jan. 11, 2018

(65) Prior Publication Data

US 2018/0204907 A1  Jul. 19, 2018

(30) Foreign Application Priority Data

Jan. 16, 2017 (TW) .............................. 106101322 A

(51) Int. Cl.
| | |
|---|---|
| *H01L 29/06* | (2006.01) |
| *H01L 29/78* | (2006.01) |
| *H01L 21/265* | (2006.01) |
| *H01L 29/66* | (2006.01) |
| *H01L 21/02* | (2006.01) |
| *H01L 29/10* | (2006.01) |

(52) U.S. Cl.
CPC .... *H01L 29/0634* (2013.01); *H01L 21/02634* (2013.01); *H01L 21/265* (2013.01); *H01L 29/1095* (2013.01); *H01L 29/66712* (2013.01); *H01L 29/7802* (2013.01)

(58) Field of Classification Search
CPC ...................................................... H01L 29/06
See application file for complete search history.

(56) References Cited

U.S. PATENT DOCUMENTS

| | | | | |
|---|---|---|---|---|
| 2011/0241111 | A1* | 10/2011 | Tamaki ............... | H01L 29/7813 257/342 |
| 2012/0049187 | A1* | 3/2012 | Haruyama ............ | H01L 29/866 257/49 |
| 2015/0061002 | A1* | 3/2015 | Tong ................. | H01L 29/42364 257/331 |

* cited by examiner

*Primary Examiner* — Marvin Payen
(74) *Attorney, Agent, or Firm* — Winston Hsu

(57) ABSTRACT

A power metal-oxide-semiconductor field-effect transistor (MOSFET) device includes a first metal layer, a substrate, an epitaxy layer, a plurality of first trench wells, a plurality of second trench wells, a plurality of body structure layers, a plurality of polysilicon layers, and a second metal layer. A part of a depletion region is formed between each first trench well and the epitaxy layer and between a body structure layer corresponding to the each first trench well and the epitaxy layer, and a rest part of the depletion region is formed between a second trench well corresponding to the each first trench well and the epitaxy layer. The plurality of second trench wells increase a breakdown voltage of the power MOSFET device and reduce a conduction resistor of the power MOSFET device.

10 Claims, 12 Drawing Sheets

POWER METAL-OXIDE-SEMICONDUCTOR FIELD-EFFECT TRANSISTOR DEVICE WITH THREE-DIMENSIONAL SUPER JUNCTION AND FABRICATION METHOD THEREOF

BACKGROUND OF THE INVENTION

1. Field of the Invention

The present invention relates to a power metal-oxide-semiconductor field-effect transistor (MOSFET) device with three-dimensional super junction and a fabrication method thereof, and particularly to a power MOSFET device and a fabrication method thereof that can increase a breakdown voltage of the power MOSFET device and reduce a conduction resistor of the power MOSFET device.

2. Description of the Prior Art

In the prior art, when a power metal-oxide-semiconductor field-effect transistor (MOSFET) device with three-dimensional super junction is turned off, the power MOSFET device utilizes a PN junction between a P-well and an N type epitaxy layer of the power MOSFET device to form a depletion region to endure a voltage between a drain and a source of the power MOSFET device. When a width of the depletion region is increased, the voltage between the drain and the source of the power MOSFET device endured by the depletion region is also increased with the width of the depletion region. Because the depletion region is formed by a horizontal diffusion between the P-well and the N type epitaxy layer, the width of the depletion region will be limited by the horizontal diffusion, resulting in a breakdown voltage of the power MOSFET device being limited by the width of the depletion region. Therefore, how to make the power MOSFET device have a higher breakdown voltage becomes an important issue.

SUMMARY OF THE INVENTION

An embodiment of the present invention provides a power MOSFET device with three-dimensional super junction. The power MOSFET device includes a first metal layer, a substrate, an epitaxy layer, a plurality of first trench wells, a plurality of second trench wells, a plurality of body structure layers, a plurality of polysilicon layers, and a second metal layer. The substrate is formed on the first metal layer. The epitaxy layer is formed on the substrate. The plurality of first trench wells are formed in the epitaxy layer. A body structure layer corresponding to each first trench well is formed on the each first trench well and in the epitaxy layer, and a part of a depletion region is formed between each first trench well and the epitaxy layer and between the body structure layer and the epitaxy layer. A second trench well corresponding to the each first trench well is formed under the each first trench well, and a rest part of the depletion region is formed between the second trench well and the epitaxy layer. Each polysilicon layer is formed on two adjacent body structure layers and the epitaxy layer, and the each polysilicon layer is covered by an oxide layer. The second metal layer is formed on the plurality of body structure layers and a plurality of oxide layers. The substrate and the epitaxy layer have a first conductivity type, the plurality of first trench wells and the plurality of second trench wells have a second conductivity type, and the plurality of second trench wells are used for increasing a breakdown voltage of the power MOSFET device and reducing a conduction resistor of the power MOSFET device.

Another embodiment of the present invention provides a fabrication method of a power MOSFET device with three-dimensional super junction. The fabrication method includes forming a substrate on a first metal layer; forming an epitaxy layer on the substrate, wherein the epitaxy layer has a first conductivity type; forming a plurality of second trenches in the epitaxy layer; filling a second epitaxy with a second conductivity type to the plurality of second trenches to form a plurality of second trench wells; depositing the epitaxy layer again; forming a plurality of first trenches in the epitaxy layer; filling a first epitaxy with the second conductivity type to the plurality of first trenches to form a plurality of first trench wells, wherein ion doping concentration of each first trench well of the plurality of first trench wells is less than ion doping concentration of a corresponding second trench well of the plurality of second trench wells; forming a plurality of body structure layers on the plurality of first trench wells and in the epitaxy layer; and forming a plurality of polysilicon layers and a second metal layer on the epitaxy layer and the plurality of body structure layers. A part of a depletion region is formed between the each first trench well and the epitaxy layer and between a body structure layer corresponding to the each first trench well and the epitaxy layer, and a rest part of the depletion region is formed between the corresponding second trench well and the epitaxy layer, wherein the plurality of second trench wells are used for increasing a breakdown voltage of the power MOSFET device and reducing a conduction resistor of the power MOSFET device.

Another embodiment of the present invention provides a fabrication method of a power MOSFET device with three-dimensional super junction. The fabrication method includes forming a substrate on a first metal layer; forming an epitaxy layer on the substrate, wherein the epitaxy layer has a first conductivity type; forming a plurality of second trench wells in the epitaxy layer by an ion implantation method; forming a rest part of the epitaxy layer and a plurality of first trench wells by a multi-epitaxy & ion implantation method, wherein the plurality of second trench wells and the plurality of first trench wells have a second conductivity type, and ion doping concentration of each first trench well of the plurality of first trench wells is less than ion doping concentration of a second trench well corresponding to the each first trench well; forming a plurality of body structure layers on the plurality of first trench wells and in the epitaxy layer; and forming a plurality of polysilicon layers and a second metal layer on the epitaxy layer and the plurality of body structure layers. A part of a depletion region is formed between the each first trench well and the epitaxy layer and between a body structure layer corresponding to the each first trench well and the epitaxy layer, and a rest part of the depletion region is formed between the second trench well and the epitaxy layer, wherein the plurality of second trench wells are used for increasing a breakdown voltage of the power MOSFET device and reducing a conduction resistor of the power MOSFET device.

The present invention provides a power MOSFET device with three-dimensional super junction and a fabrication method thereof. The power MOSFET device and the fabrication method make a depletion region corresponding to each first trench well of a plurality of first trench wells of the power MOSFET device not only be horizontally formed between the each first trench well and an epitaxy layer of the power MOSFET device, between a body structure layer of the power MOSFET device corresponding to the each first trench well and the epitaxy layer, and between a second trench well corresponding to the each first trench well and the epitaxy layer, but also be vertically formed between the second trench well and the epitaxy layer. Therefore, compared to the prior art, the depletion region provided by the present invention is larger, resulting in a breakdown voltage of the power MOSFET device being increased with increase of the depletion region. In addition, because ion doping concentration of the second trench well is greater than ion doping concentration of the each first trench well, and a width of the second trench well is less than a width of the each first trench well, when the power MOSFET device is turned on, a conduction resistor of the power MOSFET device can be reduced because a width of the epitaxy layer located between a plurality of second trench wells of the power MOSFET device is increased.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating the first channel is formed at a side of the first doped area opposite to the second doped area and the second channel is formed at a side of the second doped area opposite to the first doped area when the power MOSFET device is turned on.

DETAILED DESCRIPTION

Figure 1:
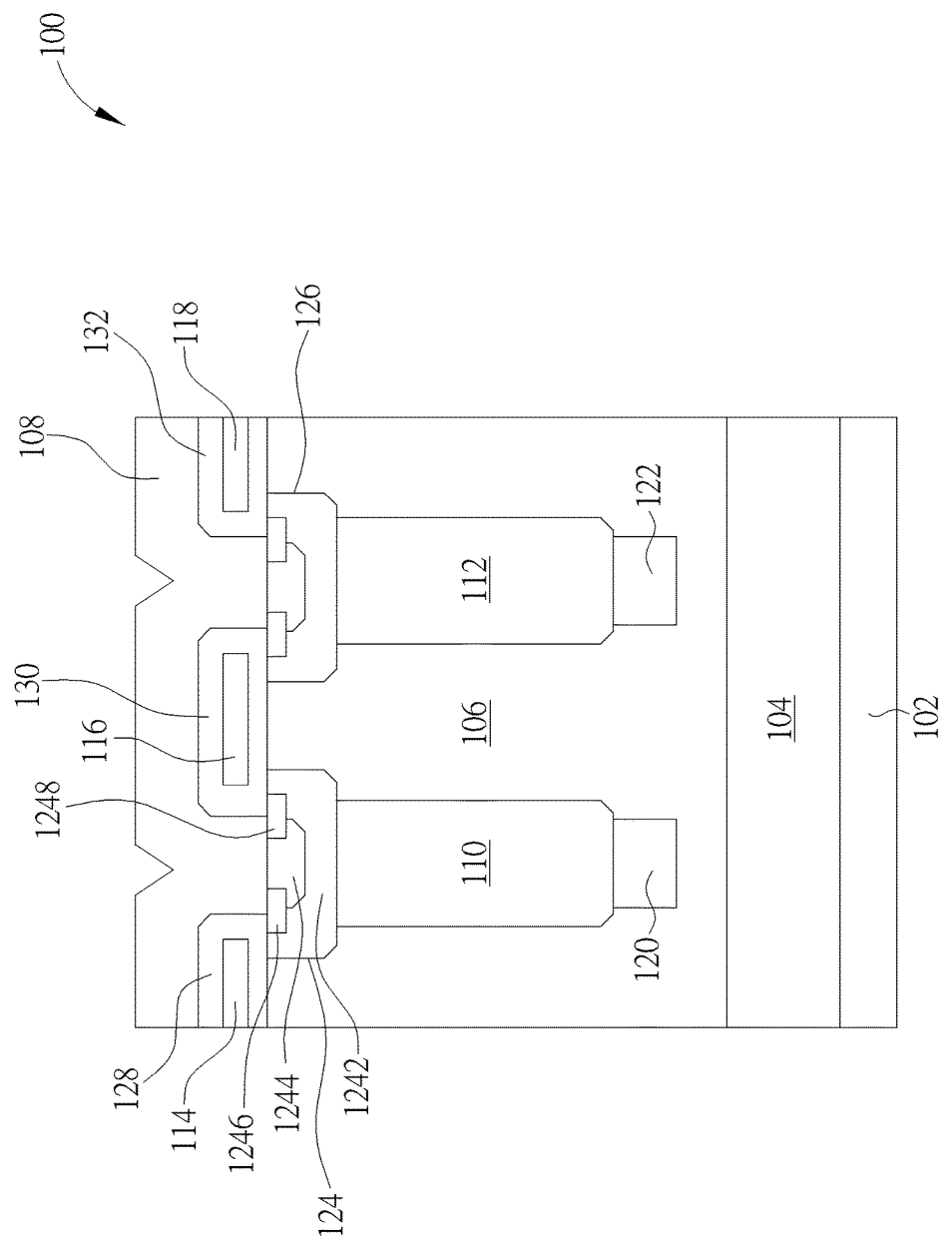
FIG. 1 is a diagram illustrating a power metal-oxide-semiconductor field-effect transistor (MOSFET) device with three-dimensional super junction according to a first embodiment of the present invention.

Please refer to FIG. 1. FIG. 1 is a diagram illustrating a power metal-oxide-semiconductor field-effect transistor (MOSFET) device 100 with three-dimensional super junction according to a first embodiment of the present invention. As shown in FIG. 1, the power MOSFET device 100 includes a first metal layer 102, a substrate 104, an epitaxy layer 106, and a second metal layer 108. In addition, FIG. 1 only further shows first trench wells 110, 112 of a plurality of first trench wells of the power MOSFET device 100, polysilicon layers 114, 116, 118 of a plurality of polysilicon layers of the power MOSFET device 100, second trench wells 120, 122 of a plurality of second trench wells of the power MOSFET device 100, and body structure layers 124, 126 of a plurality of body structure layers of the power MOSFET device 100, wherein the substrate 104 and the epitaxy layer 106 has a first conductivity type, the plurality of first trench wells and the plurality of second trench wells has a second conductivity type, ion doping concentration of the substrate 104 is greater than ion doping concentration of the epitaxy layer 106, and the first conductivity type is N type and the second conductivity type is P type. But, the present invention is not limited to the first conductivity type being N type and the second conductivity type being P type. In addition, the first metal layer 102 is a drain of the power MOSFET device 100, the plurality of polysilicon layers are gates of the power MOSFET device 100, and the second metal layer 108 is a source of the power MOSFET device 100. As shown in FIG. 1, the substrate 104 is formed on the first metal layer 102, the epitaxy layer 106 is formed on the substrate 104, the first trench wells 110, 112 are formed in the epitaxy layer 106, the second trench well 120 corresponding to the first trench well 110 is formed under the first trench well 110 and in the epitaxy layer 106, the second trench well 122 corresponding to the first trench well 112 is formed under the first trench well 112 and in the epitaxy layer 106, the body structure layer 124 is formed on the first trench well 110 and in the epitaxy layer 106, the body structure layer 126 is formed on the first trench well 112 and in the epitaxy layer 106, the polysilicon layer 116 is formed on two adjacent body structure layers (that is, the body structure layers 124, 126) and the epitaxy layer 106, and the second metal layer 108 is formed on the plurality of body structure layers and a plurality of oxide layers, wherein ion doping concentration of each second trench well of the plurality of second trench wells is greater than ion doping concentration of a corresponding first trench well of the plurality of first trench wells (e.g. ion doping concentration of the second trench well 120 is greater than ion doping concentration of the first trench well 110), and a width of the each second trench well is less than a width of the corresponding first trench well (e.g. a width of the second trench well 120 is less than a width of the first trench well 110). In addition, the plurality of first trench wells and the plurality of second trench wells are generated by a deep trench fill method. That is to say, in the deep trench fill method, the plurality of first trench wells and the plurality of second trench wells can be generated through an epitaxy method or a chemical vapor deposition (CVD). In addition, as shown in FIG. 1, the polysilicon layers 114, 116, 118 are covered by oxide layers 128, 130, 132, respectively.

As shown in FIG. 1, the body structure layer 124 includes a body 1242, a doped well 1244, a first doped area 1246, and a second doped area 1248. The body 1242 has the second conductivity type and is formed on the first trench well 110 (wherein a width of the body 1242 is greater than the width of the first trench well 110), the doped well 1244 has the second conductivity type and is formed in the body 1242, and the first doped area 1246 and the second doped area 1248 have the first conductivity type and are formed in the doped well 1244 and the body 1242, wherein ion doping concentration of the body 1242 is greater than the ion doping concentration of the first trench well 110, and ion doping concentration of the doped well 1244 is greater than the ion doping concentration of the body 1242. In addition, the substrate 104, the epitaxy layer 106, the body 1242, the doped well 1244, the first doped area 1246, and the second doped area 1248 are generated by an ion implantation method. In addition, the doped well 1244 acts as a contact of the body 1242. In addition, a structure of the body structure layer 126 and a structure of the body structure layer 124 are identical, so further description thereof is omitted for simplicity.

Figure 2:
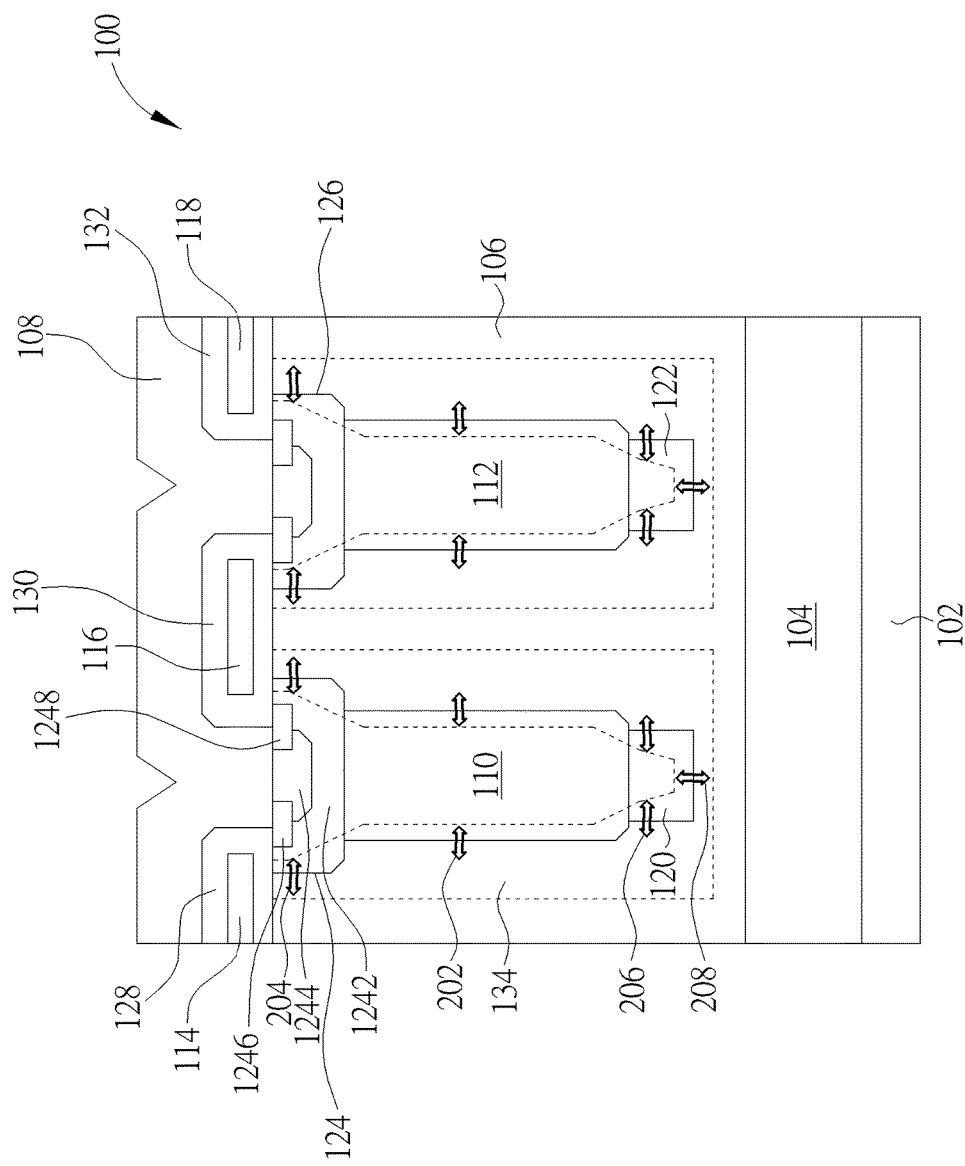
FIG. 2 is a diagram illustrating the depletion region being formed between each first trench well and the epitaxy layer, between the body structure layer corresponding to the each first trench well and the epitaxy layer, and between the second trench well corresponding to the each first trench well and the epitaxy layer when the power MOSFET device is turned off.

As shown in FIG. 2, when the power MOSFET device 100 is turned off, a part of a depletion region is formed between each first trench well of the plurality of first trench wells and the epitaxy layer 106 and between a body structure layer corresponding to the each first trench well and the epitaxy layer 106, and a rest part of the depletion region is formed between a second trench well corresponding to the each first trench well and the epitaxy layer 106. For example, when the power MOSFET device 100 is turned off, a part of a depletion region 134 (represented by a dotted line) is formed between the first trench well 110 and the epitaxy layer 106 and between the body structure layer 124 and the epitaxy layer 106, and a rest part of the depletion region 134 is formed between the second trench well 120 and the epitaxy layer 106. Therefore, as shown in FIG. 2, the depletion region 134 not only can be horizontally formed between the first trench well 110 and the epitaxy layer 106 (as shown in an arrow 202), between the body structure layer 124 and the epitaxy layer 106 (as shown in an arrow 204), and between the second trench well 120 and the epitaxy layer 106 (as shown in an arrow 206), but can also be vertically formed between the second trench well 120 and the epitaxy layer 106 (as shown in an arrow 208). Because the depletion region 134 can be further vertically formed between the second trench well 120 and the epitaxy layer 106, compared to the prior art, the depletion region 134 is larger, resulting in a breakdown voltage of the power MOSFET device 100 being increased with increase of the depletion region 134.

Figure 3:
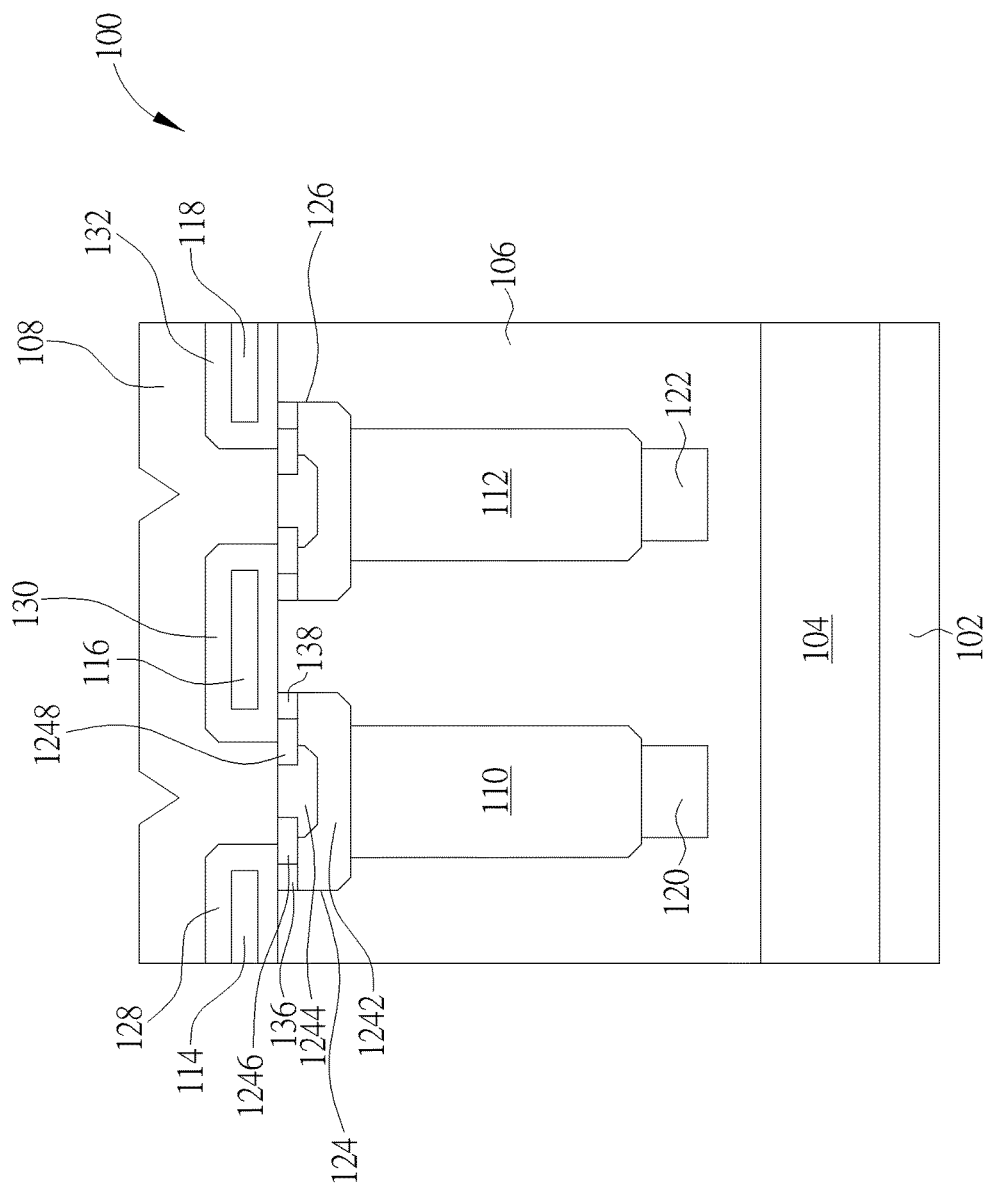

In addition, as shown in FIG. 3, when the power MOSFET device 100 is turned on, a first channel 136 is formed at a side of the first doped area 1246 opposite to the second doped area 1248 and a second channel 138 is formed at a side of the second doped area 1248 opposite to the first doped area 1246. Because the ion doping concentration of the each second trench well of the plurality of second trench wells is greater than the ion doping concentration of the corresponding first trench well of the plurality of first trench wells, and the width of the each second trench well is less than the width of the corresponding first trench well (e.g. the width of the second trench well 120 is less than the width of the first trench well 110), when the power MOSFET device 100 is turned on, a conduction resistor of the power MOSFET device 100 can be reduced because a width of the epitaxy layer 106 located between the plurality of second trench wells is increased. In addition, operational principles of turning-on and turning-off of the power MOSFET device 100 are well-known to one of ordinary skill in the art, so further description thereof is omitted for simplicity.

Figure 4:
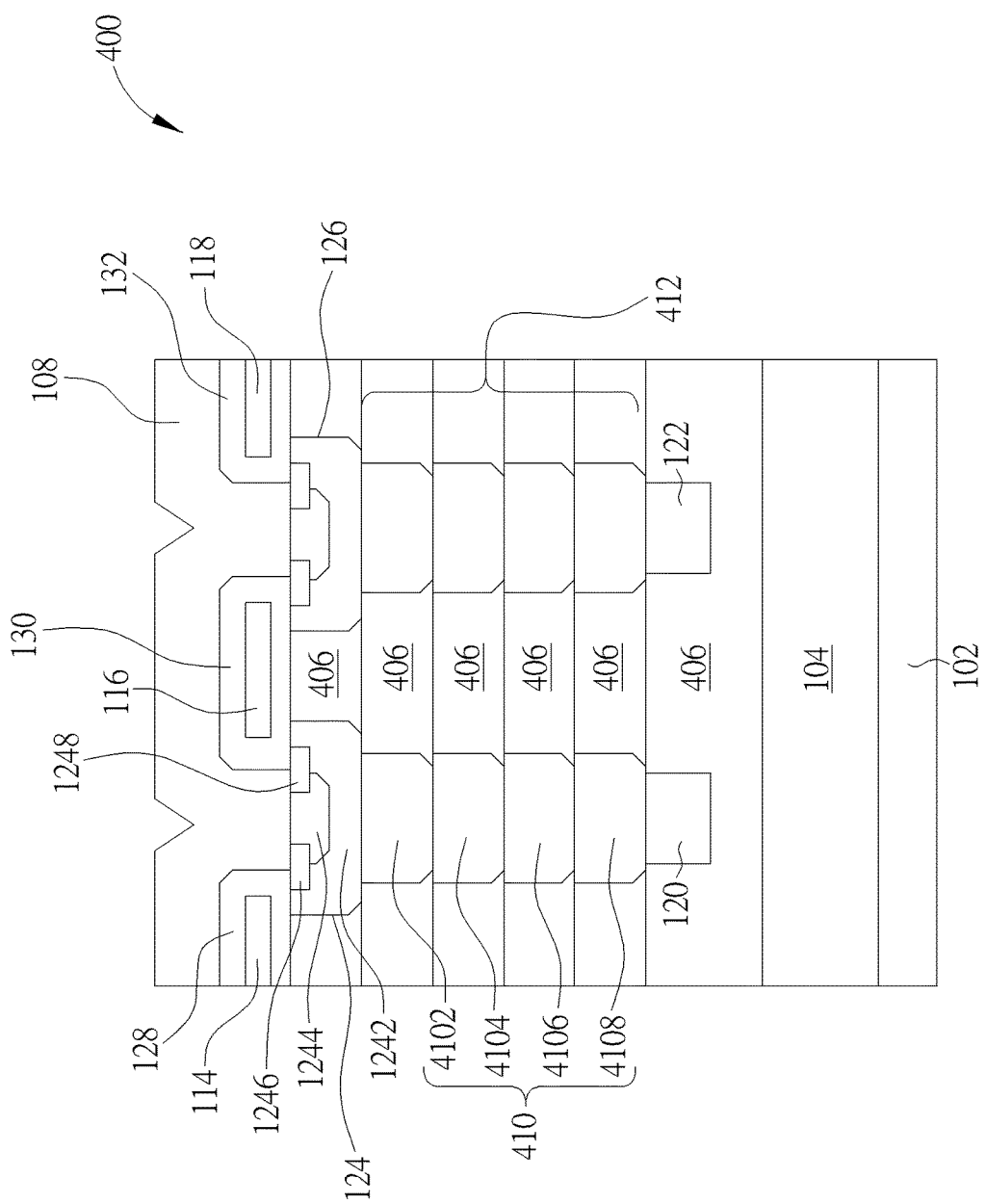
FIG. 4 is a diagram illustrating a power MOSFET device with three-dimensional super junction according to a second embodiment of the present invention.

Please refer to FIG. 4. FIG. 4 is a diagram illustrating a power MOSFET device 400 with three-dimensional super junction according to a second embodiment of the present invention. As shown in FIG. 4, a difference between the power MOSFET device 400 and the power MOSFET device 100 is that each first trench well (e.g. first trench wells 410, 412) of the power MOSFET device 400 and an epitaxy layer 406 are generated by a multi-epitaxy & ion implantation method, wherein ion doping concentration and widths of trench layers 4102-4108 of the first trench well 410 can be identical or different. For example, in one embodiment of the present invention, ion doping concentration of the trench layers 4102-4108 is gradually increased from top to bottom and widths of the trench layers 4102-4108 are identical (as shown in FIG. 4). In addition, in another embodiment of the present invention, the ion doping concentration of the trench layers 4102-4108 is gradually increased from top to bottom and the widths of the trench layers 4102-4108 is gradually decreased from top to bottom. In addition, operational principles of increase of a depletion region of the power MOSFET device 400 and decrease of a conduction resistor of the power MOSFET device 400 are the same as those of the power MOSFET device 100, so further description thereof is omitted for simplicity.

Figure 5:
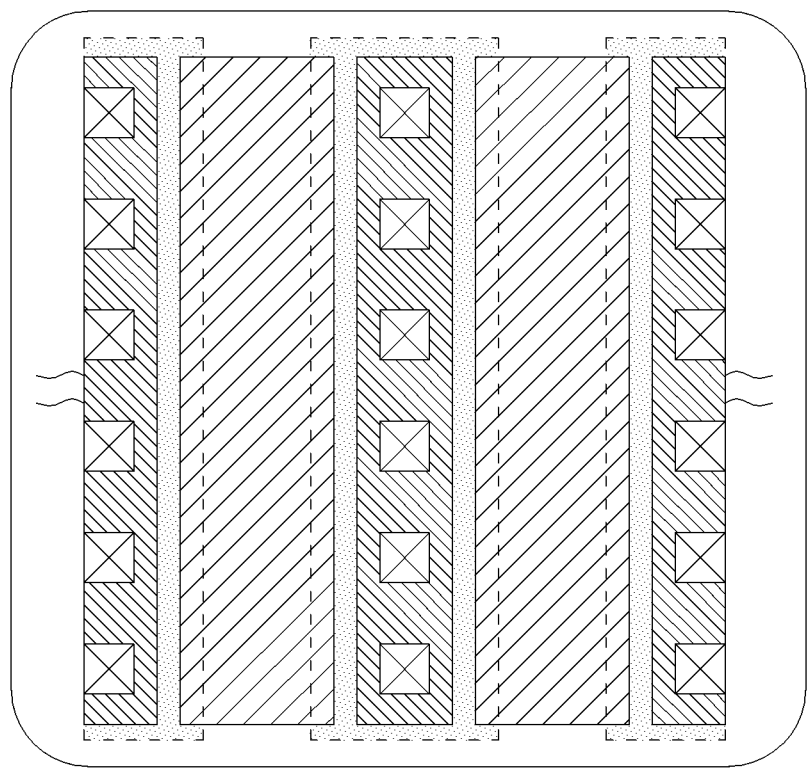
FIGS. 5-8 are diagrams illustrating top views of a power MOSFET device according to different embodiments of the present invention.
Figure 6:
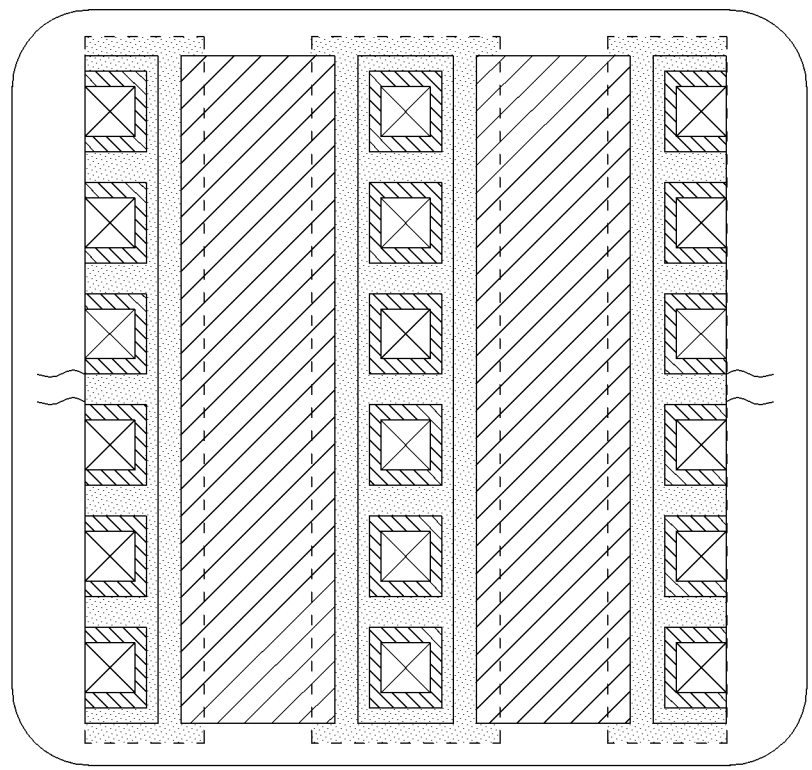
Figure 7:
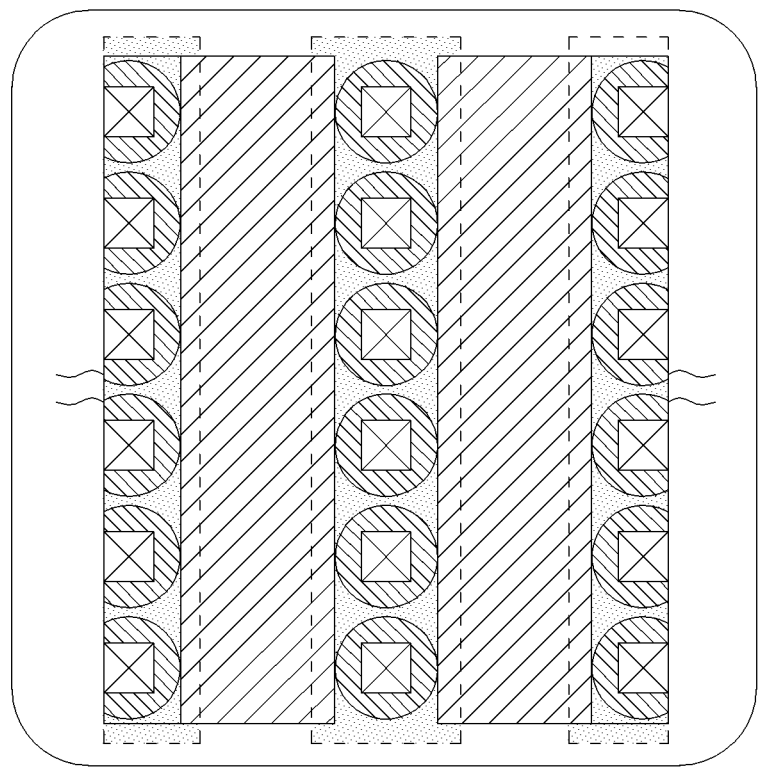
Figure 8:
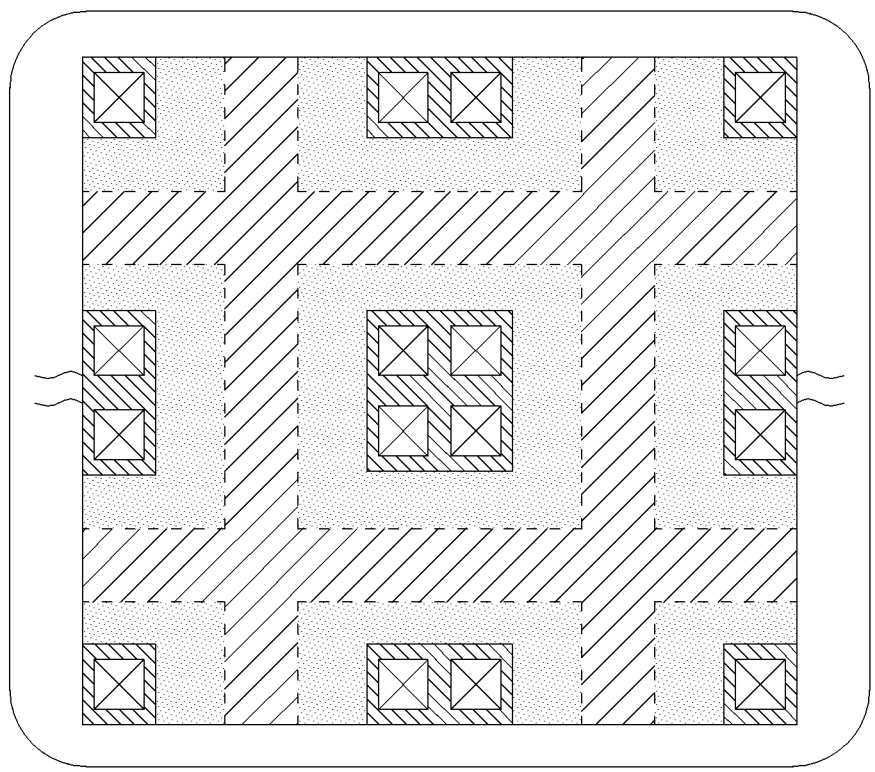

Please refer to FIGS. 5-8. FIGS. 5-8 are diagrams illustrating top views of a power MOSFET device according to different embodiments of the present invention, wherein FIGS. 5-8 only show a plurality of first trench wells, a plurality of second trench wells, a plurality of polysilicon layers, and a plurality of contacts of the power MOSFET device. As shown in FIG. 5, the plurality of first trench wells, the plurality of second trench wells, and the plurality of polysilicon layers are stripe type; as shown in FIG. 6, the plurality of first trench wells and the plurality of polysilicon layers are stripe type, and the plurality of second trench wells are island type; as shown in FIG. 7, the plurality of first trench wells and the plurality of polysilicon layers are stripe type, and the plurality of second trench wells are dot type; and as shown in FIG. 8, the plurality of first trench wells and the plurality of polysilicon layers are cross arrangement type, and the plurality of second trench wells are rectangular type. In addition, the present invention is not limited to the types of the plurality of second trench wells shown in FIGS. 5-8. That is to say, any configuration in which the plurality of second trench wells are changed with the plurality of first trench wells, and a size of each second trench well of the plurality of second trench wells is less than a size of a corresponding first trench well of the plurality of first trench wells falls within the scope of the present invention.

Figure 9:
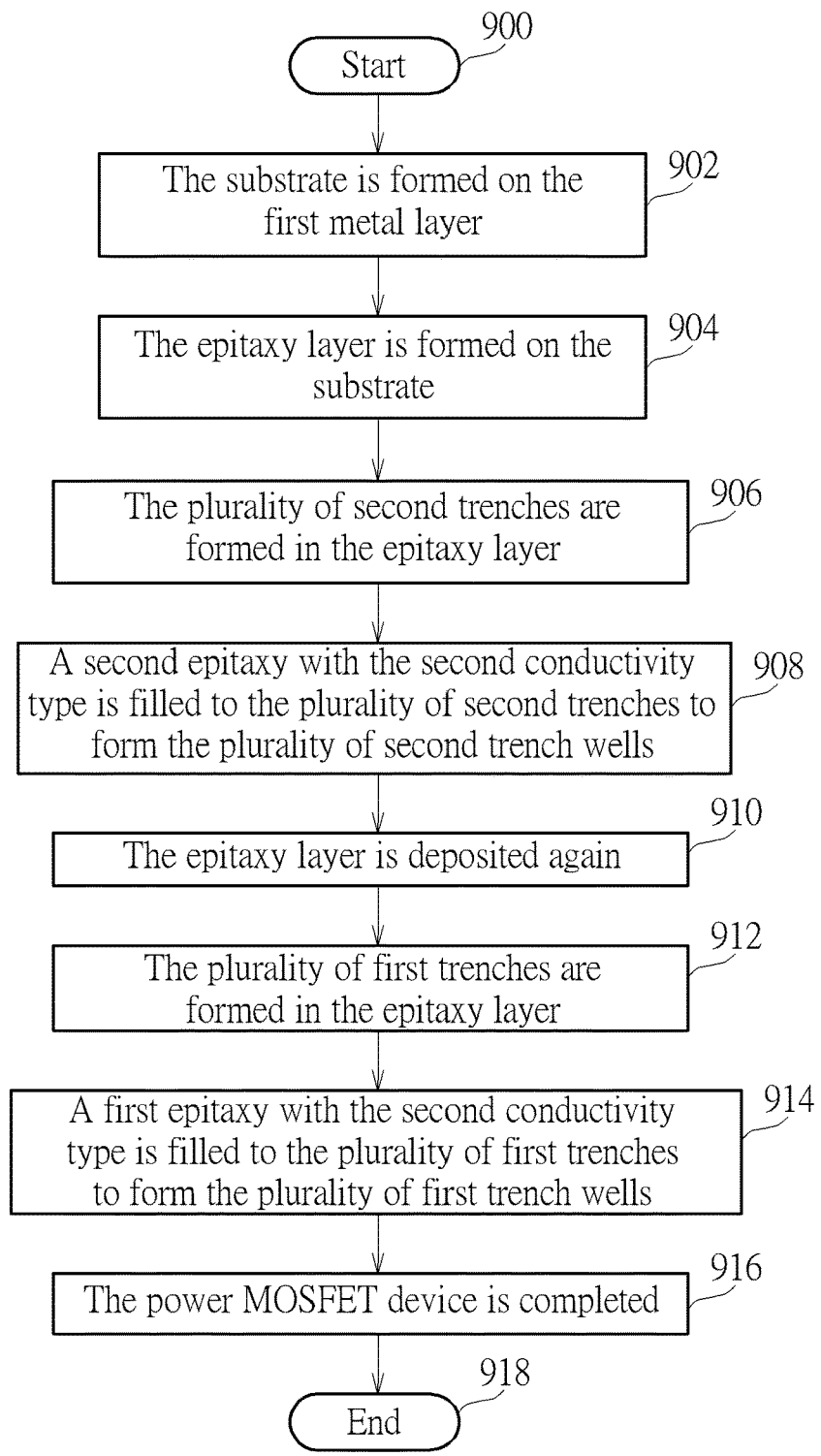
FIG. 9 is a flowchart illustrating a fabrication method of a power MOSFET device with three-dimensional super junction according to a third embodiment of the present invention.
Figure 10:
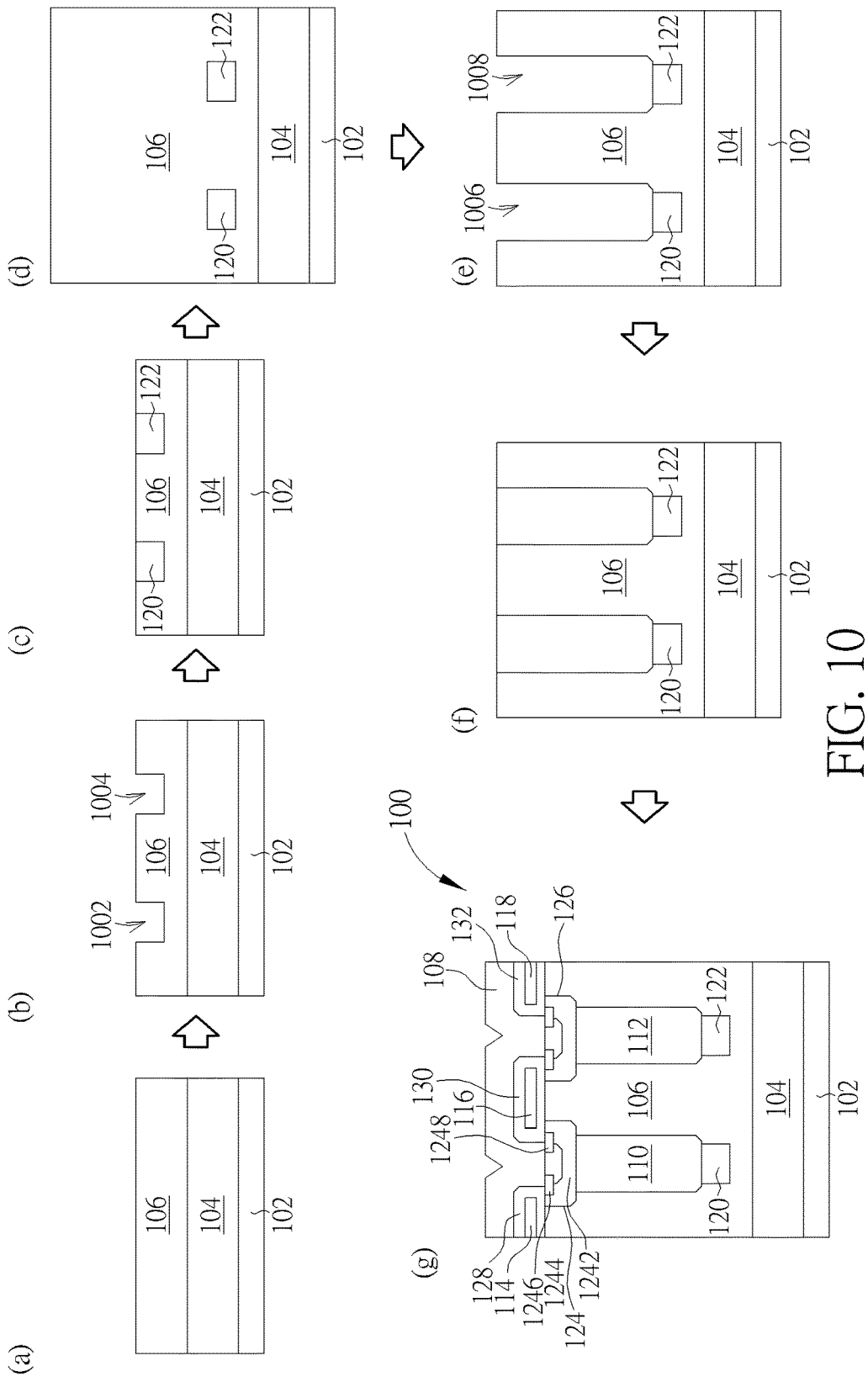
FIG. 10 is a diagram illustrating cross-sections of the power MOSFET device fabricated according to the fabrication method in FIG. 9.

Please refer to FIGS. 2, 9, 10. FIG. 9 is a flowchart illustrating a fabrication method of a power MOSFET device with three-dimensional super junction according to a third embodiment of the present invention. The fabrication method in FIG. 9 is illustrated using FIG. 10. Detailed steps are as follows:

Step 900: Start.
Step 902: The substrate 104 is formed on the first metal layer 102.
Step 904: The epitaxy layer 106 is formed on the substrate 104.
Step 906: The plurality of second trenches are formed in the epitaxy layer 106.
Step 908: A second epitaxy with the second conductivity type is filled to the plurality of second trenches to form the plurality of second trench wells.
Step 910: The epitaxy layer 106 is deposited again.
Step 912: The plurality of first trenches are formed in the epitaxy layer 106.
Step 914: A first epitaxy with the second conductivity type is filled to the plurality of first trenches to form the plurality of first trench wells.
Step 916: The power MOSFET device 100 is completed.
Step 918: End.

In Step 902 and Step 904, as shown in FIG. 10(a), the substrate 104 is formed on the first metal layer 102, and the epitaxy layer 106 is formed on the substrate 104. In Step 906, after the epitaxy layer 106 is formed on the substrate 104, the epitaxy layer 106 is etched to form the plurality of second trenches (e.g. second trenches 1002, 1004 shown in FIG. 10(b)). In Step 908, the second epitaxy is filled to the plurality of second trenches to form the plurality of second trench wells (e.g. the second trench wells 120, 122 shown in FIG. 10(c)) by the deep trench fill method. In Step 910, as shown in FIG. 10(d), the epitaxy layer 106 is deposited again. In Step 912, the epitaxy layer 106 is etched to form the plurality of first trenches (e.g. first trenches 1006, 1008 shown in FIG. 10(e)). In Step 914, the first epitaxy is filled to the plurality of first trenches to form the plurality of first trench wells (e.g. the first trench wells 110, 112 shown in FIG. 10(f)) by the deep trench fill method. In Step 916, as shown in FIG. 10(g), the power MOSFET device 100 is completed, that is, the plurality of body structure layers are formed on the plurality of first trench wells and in the epitaxy layer 106, and the plurality of polysilicon layers and the second metal layer 108 are formed on the epitaxy layer 106 and the plurality of body structure layers, wherein forming the plurality of body structure layers on the plurality of first trench wells and in the epitaxy layer 106, and forming the plurality of polysilicon layers and the second metal layer 108 on the epitaxy layer 106 and the plurality of body structure layers are well-known to one of ordinary skill in the art, so further description thereof is omitted for simplicity. In addition, the ion doping concentration of the substrate 104 is greater than the ion doping concentration of the epitaxy layer 106, and the first conductivity type is N type and the second conductivity type is P type. But, the present invention is not limited to the first conductivity type being N type and the second conductivity type being P type. In addition, the first metal layer 102 is the drain of the power MOSFET device 100, the plurality of polysilicon layers are the gates of the power MOSFET device 100, and the second metal layer 108 is the source of the power MOSFET device 100. In addition, the ion doping concentration of the each second trench well of the plurality of second trench wells is greater than the ion doping concentration of the corresponding first trench well of the plurality of first trench wells (e.g. the ion doping concentration of the second trench well 120 is greater than the ion doping concentration of the first trench well 110), and the width of the each second trench well is less than the width of the corresponding first trench well (e.g. the width of the second trench well 120 is less than the width of the first trench well 110).

In addition, as shown in FIG. 2, when the power MOSFET device 100 is turned off, the part of the depletion region 134 is formed between the first trench well 110 and the epitaxy layer 106 and between the body structure layer 124 and the epitaxy layer 106, and the rest part of the depletion region 134 is formed between the second trench well 120 and the epitaxy layer 106. Therefore, as shown in FIG. 2, the depletion region 134 not only can be horizontally formed between the first trench well 110 and the epitaxy layer 106 (as shown in the arrow 202), between the body structure layer 124 and the epitaxy layer 106 (as shown in the arrow 204), and between the second trench well 120 and the epitaxy layer 106 (as shown in the arrow 206), but can also be vertically formed between the second trench well 120 and the epitaxy layer 106 (as shown in the arrow 208). Because the depletion region 134 can be further vertically formed between the second trench well 120 and the epitaxy layer 106, compared to the prior art, the depletion region 134 is larger, resulting in the breakdown voltage of the power MOSFET device 100 being increased with increase of the depletion region 134. In addition, because the ion doping concentration of the each second trench well of the plurality of second trench wells is greater than the ion doping concentration of the corresponding first trench well of the plurality of first trench wells, and the width of the each second trench well is less than the width of the corresponding first trench well (e.g. the width of the second trench well 120 is less than the width of the first trench well 110), when the power MOSFET device 100 is turned on, the conduction resistor of the power MOSFET device 100 can be reduced because the width of the epitaxy layer 106 located between the plurality of second trench wells is increased.

Figure 11:
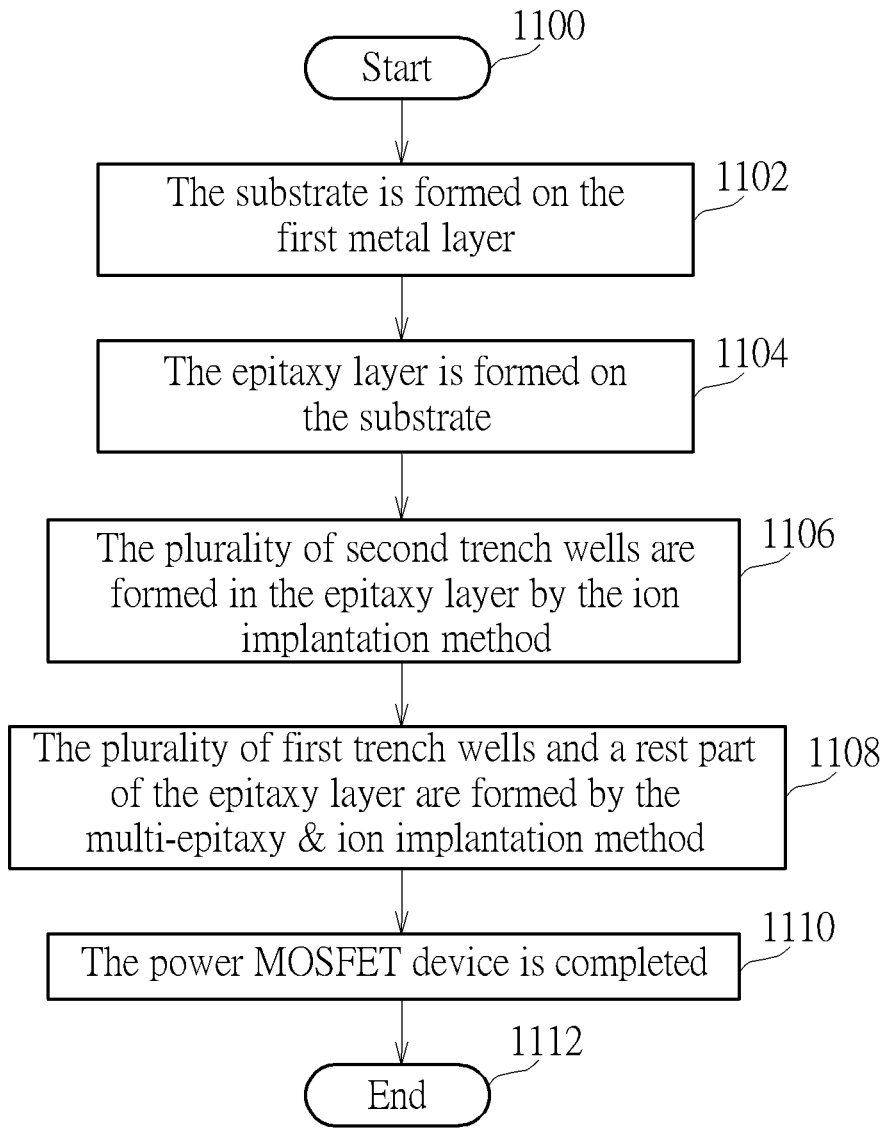
FIG. 11 is a flowchart illustrating a fabrication method of a power MOSFET device with three-dimensional super junction according to a fourth embodiment of the present invention.
Figure 12:
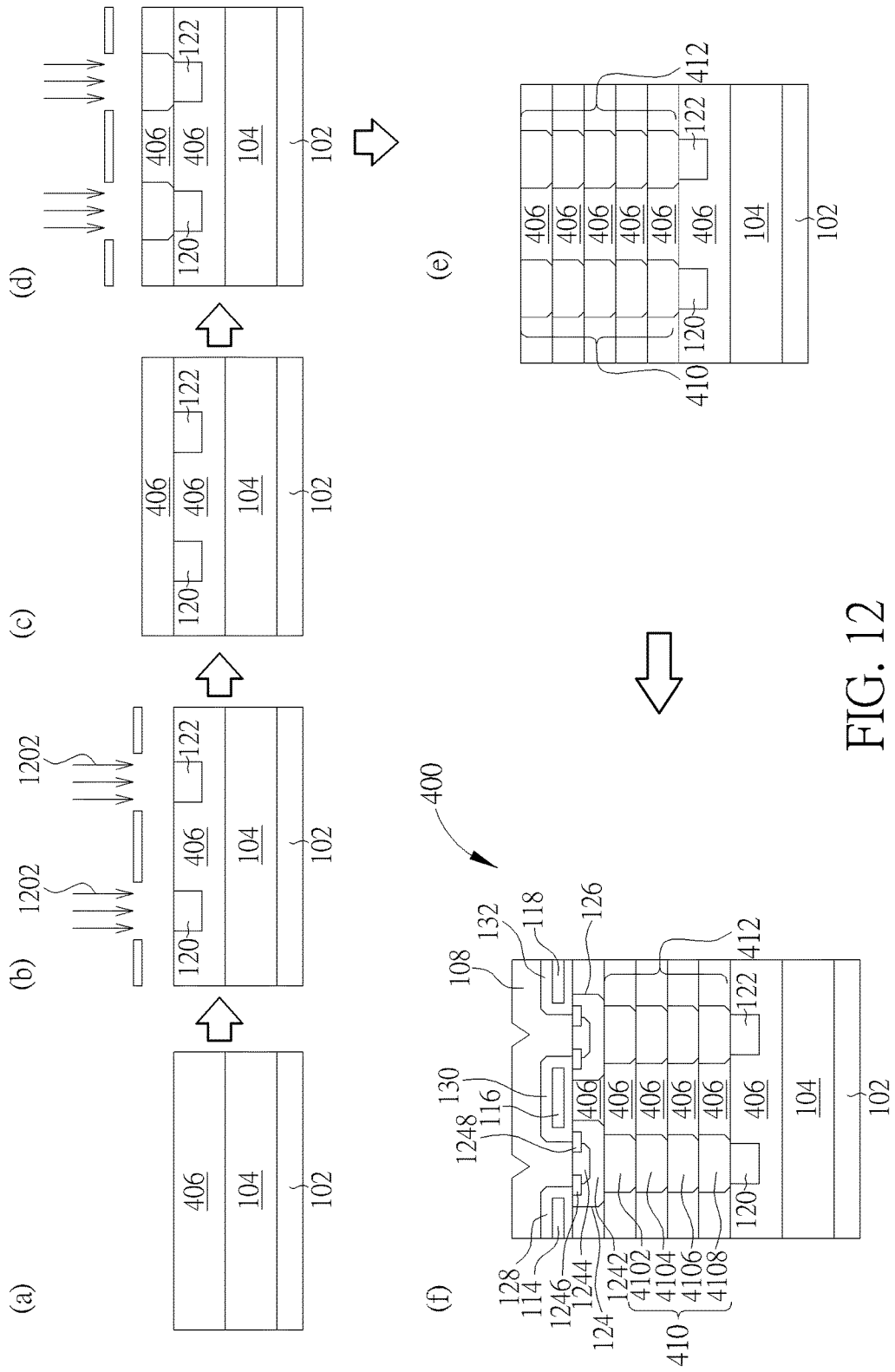
FIG. 12 is a diagram illustrating cross-sections of the power MOSFET device fabricated according to the fabrication method in FIG. 11.

Please refer to FIGS. 11, 12. FIG. 11 is a flowchart illustrating a fabrication method of a power MOSFET device with three-dimensional super junction according to a fourth embodiment of the present invention. The fabrication method in FIG. 11 is illustrated using FIG. 12. Detailed steps are as follows:

Step 1100: Start.

Step 1102: The substrate 104 is formed on the first metal layer 102.

Step 1104: The epitaxy layer 406 is formed on the substrate 104.

Step 1106: The plurality of second trench wells are formed in the epitaxy layer 406 by the ion implantation method.

Step 1108: The plurality of first trench wells and a rest part of the epitaxy layer 406 are formed by the multi-epitaxy & ion implantation method.

Step 1110: The power MOSFET device 400 is completed.

Step 1112: End.

Differences between the embodiment in FIG. 11 and the embodiment in FIG. 9 are that in Step 1106, as shown in FIG. 12(b), the plurality of second trench wells are formed by utilizing the ion implantation method to inject an ion beam 1202 to the epitaxy layer 406; and in Step 1108, as shown in FIGS. 12(c), (d), (e), the plurality of first trench wells and the rest part of the epitaxy layer 406 are formed by the multi-epitaxy & ion implantation method. As shown in FIG. 12(f), the ion doping concentration and the widths of trench layers 4102-4108 of the first trench well 410 can be identical or different. For example, in one embodiment of the present invention, the ion doping concentration of the trench layers 4102-4108 is gradually increased from top to bottom and the widths of the trench layers 4102-4108 are identical. In addition, in another embodiment of the present invention, the ion doping concentration of the trench layers 4102-4108 is gradually increased from top to bottom and the widths of the trench layers 4102-4108 is gradually decreased from top to bottom.

To sum up, the power MOSFET device with three-dimensional super junction and the fabrication method thereof make a depletion region corresponding to each first trench well of the plurality of first trench wells not only be horizontally formed between the each first trench well and the epitaxy layer, between a body structure layer corresponding to the each first trench well and the epitaxy layer, and between a second trench well corresponding to the each first trench well and the epitaxy layer, but also be vertically formed between the second trench well and the epitaxy layer. Therefore, compared to the prior art, the depletion region provided by the present invention is larger, resulting in the breakdown voltage of the power MOSFET device being increased with increase of the depletion region. In addition, because ion doping concentration of the second trench well is greater than ion doping concentration of the each first trench well, and a width of the second trench well is less than a width of the each first trench well, when the power MOSFET device is turned on, the conduction resistor of the power MOSFET device can be reduced because the width of the epitaxy layer located between the plurality of second trench wells is increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power metal-oxide-semiconductor field-effect transistor (MOSFET) device with three-dimensional super junction, comprising:
    a first metal layer;
    a substrate formed on the first metal layer;
    an epitaxy layer formed on the substrate;
    a plurality of first trench wells formed in the epitaxy layer;
    a plurality of body structure layers, wherein a body structure layer corresponding to each first trench well is formed on the each first trench well and in the epitaxy layer, and a part of a depletion region is formed between each first trench well and the epitaxy layer and between the body structure layer and the epitaxy layer;
    a plurality of second trench wells, wherein a second trench well corresponding to the each first trench well is formed under the each first trench well, and a rest part of the depletion region is formed between the second trench well and the epitaxy layer;
    a plurality of polysilicon layers, wherein each polysilicon layer is formed on two adjacent body structure layers and the epitaxy layer, and the each polysilicon layer is covered by an oxide layer; and
    a second metal layer formed on the plurality of body structure layers and a plurality of oxide layers;
    wherein the substrate and the epitaxy layer have a first conductivity type, the plurality of first trench wells and the plurality of second trench wells have a second conductivity type, and the plurality of second trench wells are used for increasing a breakdown voltage of the power MOSFET device and reducing a conduction resistor of the power MOSFET device.

2. The power MOSFET device of claim 1, wherein the second trench well and the body structure layer are further formed in the epitaxy layer.

3. The power MOSFET device of claim 1, wherein a width of the second trench well is less than a width of the each first trench well.

4. The power MOSFET device of claim 1, wherein ion doping concentration of the second trench well is greater than ion doping concentration of the each first trench well.

5. The power MOSFET device of claim 1, wherein the each first trench well is generated by a deep trench fill method.

6. The power MOSFET device of claim 1, wherein ion doping concentration of the substrate is greater than ion doping concentration of the epitaxy layer.

7. The power MOSFET device of claim 1, wherein the body structure layer comprises:
    a body having the second conductivity type and formed on the each first trench well;
    a doped well having the second conductivity type and formed in the body;
    a first doped area having the first conductivity type and formed in the doped well and the body; and
    a second doped area having the first conductivity type and formed in the doped well and the body;
    wherein ion doping concentration of the body is greater than ion doping concentration of the each first trench well, ion doping concentration of the doped well is greater than the ion doping concentration of the body, and when the power MOSFET device is turned on, a first channel is formed at a side of the first doped area opposite to the second doped area and a second channel is formed at a side of the second doped area opposite to the first doped area.

8. The power MOSFET device of claim 1, wherein the each first trench well and the epitaxy layer are generated by a multi-epitaxy & ion implantation method.

9. The power MOSFET device of claim 8, wherein ion doping concentration of the each first trench well is gradually increased from top to bottom.

10. The power MOSFET device of claim 1, wherein the first conductivity type is N type and the second conductivity type is P type.

* * * * *